(12) United States Patent
Kim

(10) Patent No.: US 9,257,170 B2
(45) Date of Patent: Feb. 9, 2016

(54) SEMICONDUCTOR DEVICES

(71) Applicant: SK hynix Inc., Icheon-si Gyeonggi-do (KR)

(72) Inventor: Chang Hyun Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 105 days.

(21) Appl. No.: 14/251,053

(22) Filed: Apr. 11, 2014

(65) Prior Publication Data

US 2015/0162073 A1    Jun. 11, 2015

(30) Foreign Application Priority Data

Dec. 10, 2013  (KR) .................. 10-2013-0152723

(51) Int. Cl.
*G11C 11/406* (2006.01)

(52) U.S. Cl.
CPC .... *G11C 11/40615* (2013.01); *G11C 11/40618* (2013.01); *G11C 2211/4065* (2013.01)

(58) Field of Classification Search
CPC .................................... G11C 11/406
USPC ....................................... 365/222
See application file for complete search history.

(56) References Cited

U.S. PATENT DOCUMENTS

| | | | | |
|---|---|---|---|---|
| 2002/0060940 | A1* | 5/2002 | Tomita | G11C 11/406 365/222 |
| 2007/0268768 | A1* | 11/2007 | Kawakubo | G11C 11/406 365/222 |
| 2009/0279373 | A1* | 11/2009 | Han | G11C 11/406 365/222 |
| 2010/0165750 | A1* | 7/2010 | Kim | G11C 7/1078 365/189.05 |
| 2012/0163111 | A1* | 6/2012 | Shim | G11C 7/04 365/222 |
| 2012/0307582 | A1 | 12/2012 | Marumoto et al. | |

FOREIGN PATENT DOCUMENTS

KR    1020130024158 A    3/2013

\* cited by examiner

*Primary Examiner* — Min Huang
(74) *Attorney, Agent, or Firm* — William Park & Associates Ltd.

(57) ABSTRACT

The semiconductor device includes a pre-internal refresh signal generator and an internal refresh signal generator. The pre-internal refresh signal generator receives a first periodic signal during a refresh operation to generate a pre-internal refresh signal including pulses which are periodically created. The internal refresh signal generator receives a second periodic signal during the refresh operation to generate first and second internal refresh signals sequentially enabled by the pulses of the pre-internal refresh signal.

18 Claims, 7 Drawing Sheets

SEMICONDUCTOR DEVICES

CROSS-REFERENCE TO RELATED APPLICATION

The present application claims priority under 35 U.S.C 119(a) to Korean Application No. 10-2013-0152723, filed on Dec. 10, 2013, in the Korean Intellectual Property Office, which is incorporated herein by reference in its entirety as set forth in full.

BACKGROUND

1. Technical Field

Embodiments of the disclosure relate to semiconductor devices.

2. Related Art

Recently, low power dynamic random access memory (DRAM) devices have been increasingly in demand with the development of mobile products. In particular, the DRAM devices employed in the mobile products have been developed to reduce a current that flows during a refresh operation.

The DRAM devices among semiconductor memory devices may lose data stored in their memory cells as the time elapses even while their power supplies are applied thereto in contrast to static random access memory (SRAM) devices or flash memory devices.

To stably and continuously retain data in DRAM cells, DRAM devices are basically accompanied with operations for periodically rewriting the data in the DRAM cells. Such operations are often called "refresh" operations.

SUMMARY

According to various embodiments, a semiconductor device includes a pre-internal refresh signal generator and an internal refresh signal generator. The pre-internal refresh signal generator is suitable for receiving a first periodic signal in response to a refresh termination command signal during a refresh operation to generate a pre-internal refresh signal including pulses which are periodically created. The internal refresh signal generator is suitable for receiving a second periodic signal during the refresh operation to generate first and second internal refresh signals sequentially enabled by the pulses of the pre-internal refresh signal.

According to various embodiments, a semiconductor device includes a periodic signal generator and a refresh signal generator. The periodic signal generator is suitable for generating first and second periodic signals periodically toggled in response to a refresh command signal. The a refresh signal generator is suitable for generating first and second internal refresh signals sequentially enabled by the first and second periodic signals from a point of time that the refresh command signal is inputted to the periodic signal generator till a point of time that a refresh termination command signal is inputted.

According to an embodiment, a semiconductor device includes a periodic signal generator configured to receive a refresh command signal to generate a first periodic signal and a second periodic signal which are periodically toggled during a refresh operation. The semiconductor device also includes a pre-internal refresh signal generator configured to receive the first periodic signal to generate a pre-internal refresh signal before a refresh termination command signal. Further, the semiconductor device also includes an internal refresh signal generator configured to receive the second period signal to generate first to fourth internal refresh signals enabled by the pre-internal refresh signal.

According to an embodiment, the semiconductor device, further comprising a plurality of banks configured to execute the refresh operation when the first to fourth internal refresh signals are enabled.

DETAILED DESCRIPTION

Various embodiments of the disclosure will be described more fully hereinafter with reference to the accompanying drawings. However, the embodiments described are for illustrative purposes only and are not intended to limit the scope of the disclosure. A refresh operation is carried out, in retention times that are inherent in memory cells of banks, by activating word lines at least once or more and by sensing/amplifying data of the memory cells. The retention time is a time for which data can be maintained without a refresh operation after being written into a memory cell. The refresh operation may be periodically executed by internal commands generated in the DRAM device or by external commands supplied from an external system.

Figure 1:
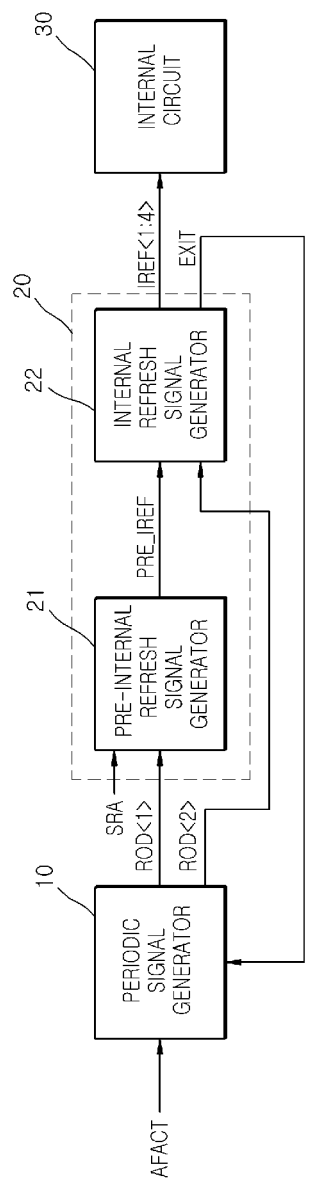
FIG. 1 is a block diagram illustrating a semiconductor device according to various embodiments of the present disclosure.

Referring to FIG. 1, a semiconductor device according to various embodiments may include a periodic signal generator 10, a refresh signal generator 20 and an internal circuit 30.

A refresh command signal AFACT may be applied to the periodic signal generator 10 in a refresh mode to generate first and second periodic signals ROD<1:2>. The first and second period signals ROD<1:2> may be periodically toggled. More specifically, the periodic signal generator 10 may generate the first and second periodic signals ROD<1:2> periodically toggled during a refresh operation. In addition, the second periodic signal ROD<2> may have an opposite phase to the first periodic signal ROD<1> during the refresh operation.

The refresh signal generator 20 may include a pre-internal refresh signal generator 21 and an internal refresh signal generator 22.

The first period signal ROD<1> may be applied to the pre-internal refresh signal generator 21 to generate a pre-internal refresh signal PRE_IREF. The pre-internal refresh signal PRE_IREF may include pulses. The pulses may be periodically created if a refresh termination command signal SRA is not inputted during the refresh operation.

The second period signal ROD<2> may be applied to the internal refresh signal generator 22 to generate first to fourth internal refresh signals IREF<1:4>. The first to fourth internal refresh signals IREF<1:4> are sequentially enabled by the pulses of the pre-internal refresh signal PRE_IREF.

The internal circuit 30 may include a plurality of banks in which the refresh operation is executed in response to the first to fourth internal refresh signals IREF<1:4>.

Figure 2:
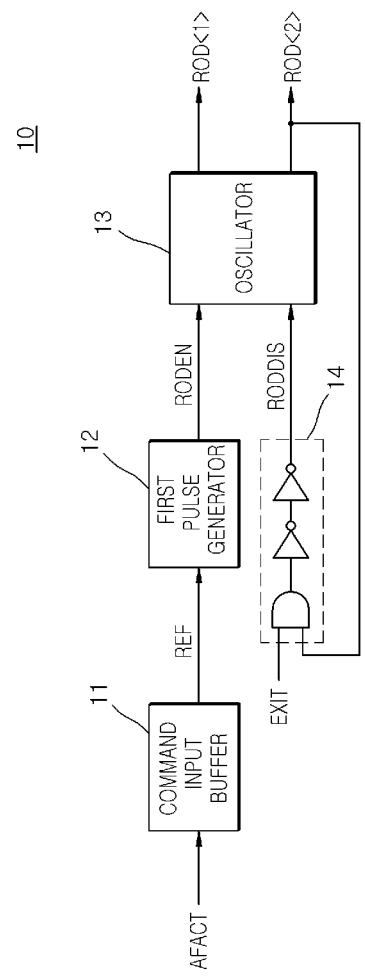
FIG. 2 is a block diagram illustrating a periodic signal generator included in the semiconductor device of FIG. 1.

Referring to FIG. 2, the periodic signal generator 10 may include a command input buffer 11, a first pulse generator 12, an oscillator 13 and a first logic unit 14.

The command input buffer 11 may generate a refresh signal REF enabled to have a logic "high" level when the refresh command signal AFACT is applied. The refresh command signal AFACT may be supplied from an external system or an external device to execute the refresh operation.

The first pulse generator 12 may generate an enablement signal RODEN. The enablement signal may include a pulse created when the refresh signal REF is enabled to have a logic "high" level.

The oscillator 13 may generate the first and second periodic signals ROD<1:2>. The first and second period signals ROD<1:2> may be periodically toggled when the pulse of the enablement signal RODEN is applied. The first and second periodic signals ROD<1:2> may not be toggled when a disablement signal RODDIS having a logic "high" level is inputted to the oscillator 13.

If a termination signal EXIT having a logic "high" level is applied to the first logic unit 14 may generate the disablement signal RODDIS enabled to have a logic "high" level after a predetermined delay time elapses. The termination signal EXIT may be inputted to the first logic unit 14 while the second periodic signal ROD<2> has a logic "high" level. The predetermined delay time of the first logic unit 14 may be set to be less than a cycle time of the first and second periodic signals ROD<1:2>.

Figure 3:
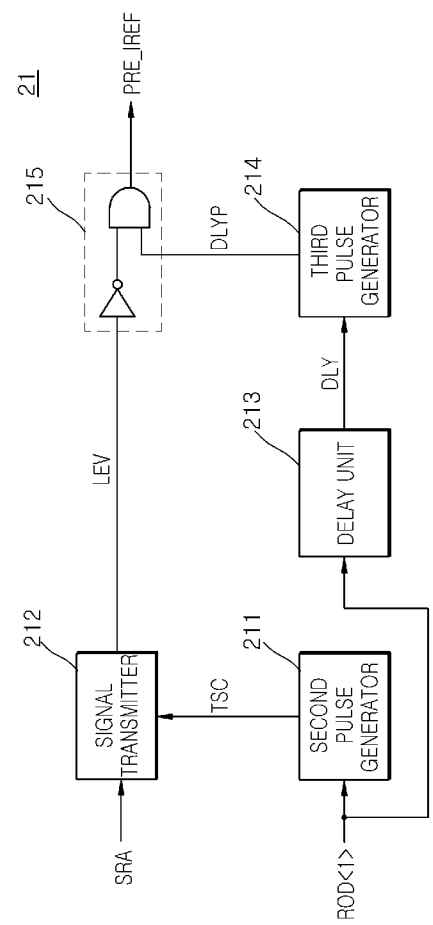
FIG. 3 is a block diagram illustrating a pre-internal refresh signal generator included in a refresh signal generator of the semiconductor device shown in FIG. 1.

Referring to FIG. 3, the pre-internal refresh signal generator 21 may include a second pulse generator 211, a signal transmitter 212, a delay unit 213, a third pulse generator 214 and a second logic unit 215.

The second pulse generator 211 may generate a transmission control signal TSC including pulses created at points of time that a level of the first periodic signal ROD<1> changes from a logic "low" level to a logic "high" level.

The signal transmitter 212 may latch the refresh termination command signal SRA in response to the pulses of the transmission control signal TSC to generate a level signal LEV.

The delay unit 213 may retard the first periodic signal ROD<1> by a predetermined time to generate a delay signal DLY.

The third pulse generator 214 may generate a delay pulse signal DLYP. Moreover, the delay pulse signal DLYP may include pulses created at points of time that a level of the delay signal DLY changes from a logic "low" level to a logic "high" level.

The second logic unit 215 may buffer the delay pulse signal DLYP to generate the pre-internal refresh signal PRE_IREF while the level signal LEV has a logic "low" level. The second logic unit 215 may also generate the pre-internal refresh signal PRE_IREF having a logic "low" level while the level signal LEV has a logic "high" level.

Figure 4:
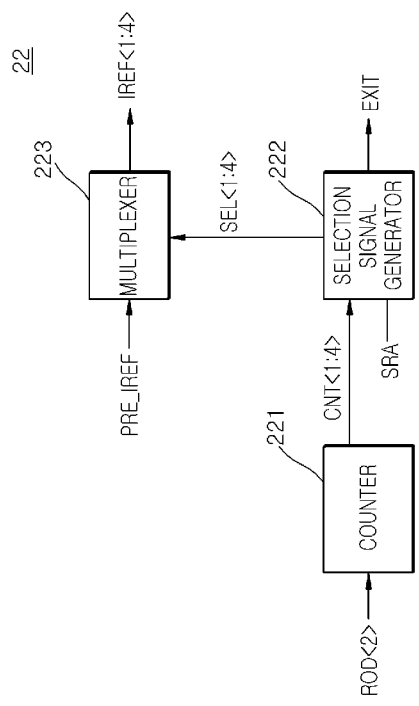
FIG. 4 is a block diagram illustrating an internal refresh signal generator included in a refresh signal generator of the semiconductor device shown in FIG. 1.

Referring to FIG. 4, the internal refresh signal generator 22 may include a counter 221, a selection signal generator 222 and a multiplexer 223.

The counter 221 may output first to fourth count signals CNT<1:4> counted whenever a level of the second periodic signal ROD<2> changes from a logic "low" level to a logic "high" level. The first to fourth count signals CNT<1:4> may be initialized such that the first count signal CNT<1> has a logic "high" level and the second to fourth count signals CNT<2:4> have a logic "low" level. The number of bits of the first to fourth count signals CNT<1:4> may be set to be different according to the various embodiments. Further, the first to fourth count signals CNT<1:4> may be generated to have different level combinations.

The selection signal generator 222 may output the first to fourth count signals CNT<1:4> as first to fourth selection signals SEL<1:4>. The selection signal generator 222 may generate the termination signal EXIT. The termination signal EXIT may be enabled when a level combination of the first to fourth count signals CNT<1:4> generated by a counting operation of the counter 221 is identical to a predetermined level combination. In the alternative, the terminal signal EXIT may be enabled when the refresh termination command signal SRA is inputted thereto. For example, the level combination of the first to fourth count signals CNT<1:4> may be regarded as being identical to the predetermined level combination. This may occur when all of the first to fourth count signals CNT<1:4> have logic "low" levels after the fourth count signal CNT<4> is generated by the counting operation of the counter 221. However, the level combination of the first to fourth count signals CNT<1:4> may be set to be different according to various embodiments. In addition, the number of bits of the first to fourth selection signals SEL<1:4> may be set to be different according to various embodiments In addition, a level combination of the first to fourth selection signals SEL<1:4> may be generated to have different level combinations according to various embodiments.

The multiplexer 223 may output a pulse of the pre-internal refresh signal PRE_IREF as a pulse of one of the first to fourth internal refresh signals IREF<1:4> in response to the first to fourth selection signals SEL<1:4>. More specifically, the multiplexer 223 may output a pulse of the pre-internal refresh signal PRE_IREF as a pulse of the first internal refresh signal IREF<1> when the first selection signal SEL<1> is generated to have a logic "high" level. The multiplexer 223 may output a pulse of the pre-internal refresh signal PRE_IREF as a pulse of the second internal refresh signal IREF<2> when the second selection signal SEL<2> is generated to have a logic "high" level. Further, the multiplexer 223 may output a pulse of the pre-internal refresh signal PRE_IREF as a pulse of the third internal refresh signal IREF<3> when the third selection signal SEL<3> is generated to have a logic "high" level. In addition, the multiplexer 223 may output a pulse of the pre-internal refresh signal PRE_IREF as a pulse of the fourth internal refresh signal IREF<4> when the fourth selection signal SEL<4> is generated to have a logic "high" level.

Figure 5:
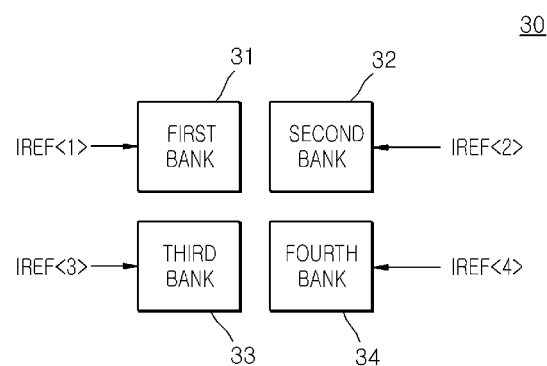
FIG. 5 is a block diagram illustrating an internal circuit included in the semiconductor device of FIG. 1.

Referring to FIG. 5, the internal circuit 30 may include first to fourth banks 31, 32, 33 and 34.

When the first internal refresh signal IREF<1> is applied to the first bank 31, the first bank 31 may execute the refresh operation.

The second bank 32 may execute the refresh operation when the second internal refresh signal IREF<2> having a logic "high" level is inputted thereto.

The third bank 33 may execute the refresh operation when the third internal refresh signal IREF<3> having a logic "high" level is applied.

When the fourth internal refresh signal IREF<4> is applied to the fourth bank 34, the fourth bank 34 may execute the refresh operation.

Figure 6:
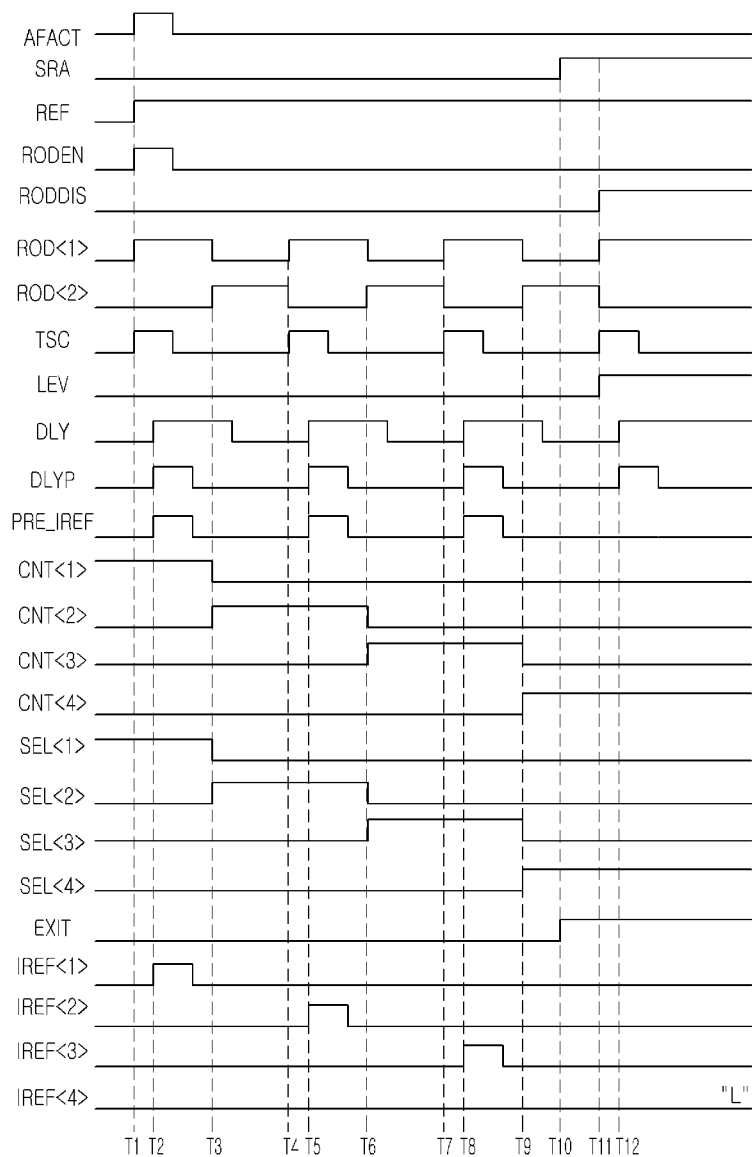
FIG. 6 is a timing diagram illustrating an operation of a semiconductor device according to various embodiments of the present disclosure.

An operation of the semiconductor device having the aforementioned configuration will be described hereinafter with reference to FIG. 6. Moreover, FIG. 6 will be described with an example in which the refresh operation terminates after the first to third banks 31, 32 and 33 are refreshed in response to the refresh termination command signal SRA in the refresh mode.

At a point of time "T1," the command input buffer 11 of the periodic signal generator 10 may receive the refresh command signal AFACT supplied from an external device to generate the refresh signal REF. The refresh signal REF may be enabled to have a logic "high" level for execution of the refresh operation. The first pulse generator 12 may receive the refresh signal REF having a logic "high" level to generate a pulse of the enablement signal RODEN. The oscillator 13 may receive the pulse of the enablement signal RODEN to toggle the first periodic signal ROD<1> from a logic "low" level to a logic "high" level. In such a situation, the second periodic signal ROD<2> is not toggled.

The second pulse generator 211 of the pre-internal refresh signal generator 21 may receive the first periodic signal ROD<1>. The first period signal ROD<1> may be toggled from a logic "low" level to a logic "high" level, to generate a pulse of the transmission control signal TSC. The signal transmitter 212 may latch the refresh termination command signal SRA having a logic "low" level in response to the pulse of the transmission control signal TSC to generate the level signal LEV having a logic "low" level.

At time "T2," the delay unit 213 of the pre-internal refresh signal generator 21 may retard the first periodic signal ROD<1> to generate the delay signal DLY. The delay signal DLY may be toggled from a logic "low" level to a logic "high" level. The third pulse generator 214 may receive the delay signal DLY to generate a pulse of the delay pulse signal DLYP. The second logic unit 215 may buffer the delay pulse signal DLYP in response to the level signal LEV having a logic "low" level to generate a pulse of the pre-internal refresh signal PRE_IREF.

The counter 221 of the internal refresh signal generator 22 may receive the second periodic signal ROD<2> having a logic "low" level not to count the first to fourth count signals CNT<1:4>. In such an instance, the first to fourth count signals CNT<1:4> may have initialized logic levels. More specifically, the first count signal CNT<1> may have a logic "high" level and all of the second to fourth count signals CNT<2:4> may have logic "low" levels. The selection signal generator 222 may output the first to fourth count signals CNT<1:4> as the first to fourth selection signals SEL<1:4>. Consequently, the first selection signal SEL<1> may have a logic "high" level. The multiplexer 223 may then receive the first selection signal SEL<1> having a logic "high" level to output a pulse of the pre-internal refresh signal PRE_IREF as a pulse of the first internal refresh signals IREF<1>.

The first bank 31 of the internal circuit 30 may receive the pulse of the first internal refresh signals IREF<1> to execute a refresh operation.

At time "T3," the oscillator 13 of the periodic signal generator 10 may toggle the first periodic signal ROD<1> from a logic "high" level to a logic "low" level. The oscillator 13 may also toggle the second periodic signal ROD<2> from a logic "low" level to a logic "high" level.

The counter 221 of the internal refresh signal generator 22 may count the first to fourth count signals CNT<1:4> in response to the second periodic signal ROD<2> having a logic "high" level. Accordingly, the counter 221 may output the first count signal CNT<1> having a logic "low" level, the second count signal CNT<2> having a logic "high" level, the third count signal CNT<3> having a logic "low" level, and the fourth count signal CNT<4> having a logic "low" level. The selection signal generator 222 may output the first to fourth count signals CNT<1:4> as the first to fourth selection signals SEL<1:4>. As a result, the second selection signal SEL<2> may have a logic "high" level.

At time "T4," the oscillator 13 of the periodic signal generator 10 may toggle the first periodic signal ROD<1> from a logic "low" level to a logic "high" level. The oscillator 13 may also toggle the second periodic signal ROD<2> from a logic "high" level to a logic "low" level.

The second pulse generator 211 of the pre-internal refresh signal generator 21 may receive the first periodic signal ROD<1>, to generate a pulse of the transmission control signal TSC. The first period signal ROD<1> may be toggled from a logic "low" level to a logic "high" level. The signal transmitter 212 may latch the refresh termination command signal SRA having a logic "low" level in response to the pulse of the transmission control signal TSC to generate the level signal LEV having a logic "low" level.

At time "T5," the delay unit 213 of the pre-internal refresh signal generator 21 may retard the first periodic signal ROD<1> to generate the delay signal DLY toggled from a logic "low" level to a logic "high" level. The third pulse generator 214 may receive the delay signal DLY to generate a pulse of the delay pulse signal DLYP. The delay signal DLY may be toggled from a logic "low" level to a logic "high" level. The second logic unit 215 may buffer the delay pulse signal DLYP in response to the level signal LEV having a logic "low" level to generate a pulse of the pre-internal refresh signal PRE_IREF.

The counter 221 of the internal refresh signal generator 22 may receive the second periodic signal ROD<2> having a logic "low" level not to count the first to fourth count signals CNT<1:4>. The selection signal generator 222 may output the first to fourth count signals CNT<1:4> as the first to fourth selection signals SEL<1:4>. As a result, the second selection signal SEL<2> may have a logic "high" level. The multiplexer 223 may receive the second selection signal SEL<2> having a logic "high" level. As a result, the multiplexer 223 may output a pulse of the pre-internal refresh signal PRE_IREF as a pulse of the second internal refresh signals IREF<2>.

The second bank 32 of the internal circuit 30 may receive the pulse of the second internal refresh signals IREF<2> to execute a refresh operation.

At time "T6," the oscillator 13 of the periodic signal generator 10 may toggle the first periodic signal ROD<1> from a logic "high" level to a logic "low" level. The oscillator 13 may also toggle the second periodic signal ROD<2> from a logic "low" level to a logic "high" level.

The counter 221 of the internal refresh signal generator 22 may count the first to fourth count signals CNT<1:4> in response to the second periodic signal ROD<2> having a logic "high" level. Consequently, the counter may output the first count signal CNT<1> having a logic "low" level, the second count signal CNT<2> having a logic "low" level, the third count signal CNT<3> having a logic "high" level, and the fourth count signal CNT<4> having a logic "low" level. The selection signal generator 222 may output the first to fourth count signals CNT<1:4> as the first to fourth selection signals SEL<1:4>. As a result, the third selection signal SEL<3> may have a logic "high" level.

At time "T7," the oscillator 13 of the periodic signal generator 10 may toggle the first periodic signal ROD<1> from a logic "low" level to a logic "high" level. Further, the oscillator 13 may toggle the second periodic signal ROD<2> from a logic "high" level to a logic "low" level.

The second pulse generator 211 of the pre-internal refresh signal generator 21 may receive the first periodic signal ROD<1>, toggled from a logic "low" level to a logic "high"

level, to generate a pulse of the transmission control signal TSC. The signal transmitter 212 may latch the refresh termination command signal SRA having a logic "low" level in response to the pulse of the transmission control signal TSC. As a result, the transmitter 212 may generate the level signal LEV having a logic "low" level.

At time "T8," the delay unit 213 of the pre-internal refresh signal generator 21 may retard the first periodic signal ROD<1> to generate the delay signal DLY. The delay signal DLY may be toggled from a logic "low" level to a logic "high" level. The third pulse generator 214 may receive the delay signal DLY to generate a pulse of the delay pulse signal DLYP. The second logic unit 215 may buffer the delay pulse signal DLYP in response to the level signal LEV having a logic "low" level to generate a pulse of the pre-internal refresh signal PRE_IREF.

The counter 221 of the internal refresh signal generator 22 may receive the second periodic signal ROD<2> having a logic "low" level not to count the first to fourth count signals CNT<1:4>. The selection signal generator 222 may output the first to fourth count signals CNT<1:4> as the first to fourth selection signals SEL<1:4>. As a result, the third selection signal SEL<3> may have a logic "high" level. The multiplexer 223 may receive the third selection signal SEL<3> having a logic "high" level. Accordingly, the multiplexer may output a pulse of the pre-internal refresh signal PRE_IREF as a pulse of the third internal refresh signals IREF<3>.

The third bank 33 of the internal circuit 30 may receive the pulse of the third internal refresh signals IREF<3> to execute a refresh operation.

At time "T9," the oscillator 13 of the periodic signal generator 10 may toggle the first periodic signal ROD<1> from a logic "high" level to a logic "low" level. The oscillator 13 may also toggle the second periodic signal ROD<2> from a logic "low" level to a logic "high" level.

The counter 221 of the internal refresh signal generator 22 may count the first to fourth count signals CNT<1:4> in response to the second periodic signal ROD<2> having a logic "high" level. The counter 221 may then output the first count signal CNT<1> having a logic "low" level, the second count signal CNT<2> having a logic "low" level, the third count signal CNT<3> having a logic "low" level, and the fourth count signal CNT<4> having a logic "high" level. The selection signal generator 222 may output the first to fourth count signals CNT<1:4> as the first to fourth selection signals SEL<1:4>. As a result, the fourth selection signal SEL<4> among the first to fourth selection signal SEL<1:4> may have a logic "high" level.

At time "T10," the selection signal generator 222 may receive the refresh termination command signal SRA to generate the termination signal EXIT having a logic "high" level to terminate the refresh operation. The refresh termination command signal SRA may be received from an external device or an external system.

At time "T11," the oscillator 13 of the periodic signal generator 10 may toggle the first periodic signal ROD<1> from a logic "low" level to a logic "high" level. In addition, the oscillator 13 may toggle the second periodic signal ROD<2> from a logic "high" level to a logic "low" level. In such an instance, the first logic unit 14 of the periodic signal generator 10 may receive the termination signal EXIT having a logic "high" level and the second periodic signal ROD<2> from a logic "high" level. As a result, the first logic unit 14 may generate the disablement signal RODDIS having a logic "high" level.

The second pulse generator 211 of the pre-internal refresh signal generator 21 may receive the first periodic signal ROD<1>, toggled from a logic "low" level to a logic "high" level, to generate a pulse of the transmission control signal TSC. The signal transmitter 212 may latch the refresh termination command signal SRA having a logic "high" level in response to the pulse of the transmission control signal TSC. As a result, the signal transmitter 212 may generate the level signal LEV having a logic "high" level.

At time "T12," the delay unit 213 of the pre-internal refresh signal generator 21 may retard the first periodic signal ROD<1> to generate the delay signal DLY toggled from a logic "low" level to a logic "high" level. The third pulse generator 214 may receive the delay signal DLY which is toggled from a logic "low" level to a logic "high" level, to generate a pulse of the delay pulse signal DLYP. The second logic unit 215 may receive the level signal LEV having a logic "high" level to generate pre-internal refresh signal PRE_IREF having a logic "low" level.

The counter 221 of the internal refresh signal generator 22 may receive the second periodic signal ROD<2> having a logic "low" level not to count the first to fourth count signals CNT<1:4>. The selection signal generator 222 may output the first to fourth count signals CNT<1:4> as the first to fourth selection signals SEL<1:4>. As a result, the fourth selection signal SEL<4> may have a logic "high" level. The multiplexer 223 may receive the fourth selection signal SEL<4> having a logic "high" level. Upon receipt of the fourth selection signal SEI<4>, the multiplexer may output the pre-internal refresh signal PRE_IREF having a logic "low" level as the fourth internal refresh signals IREF<4>.

The fourth bank 34 of the internal circuit 30 may receive the fourth internal refresh signals IREF<4> having a logic "low" level not to execute a refresh operation.

The oscillator 13 of the periodic signal generator 10 may receive the disablement signal RODDIS having a logic "high" level to not toggle the first and second periodic signals ROD<1:2>.

Figure 7:
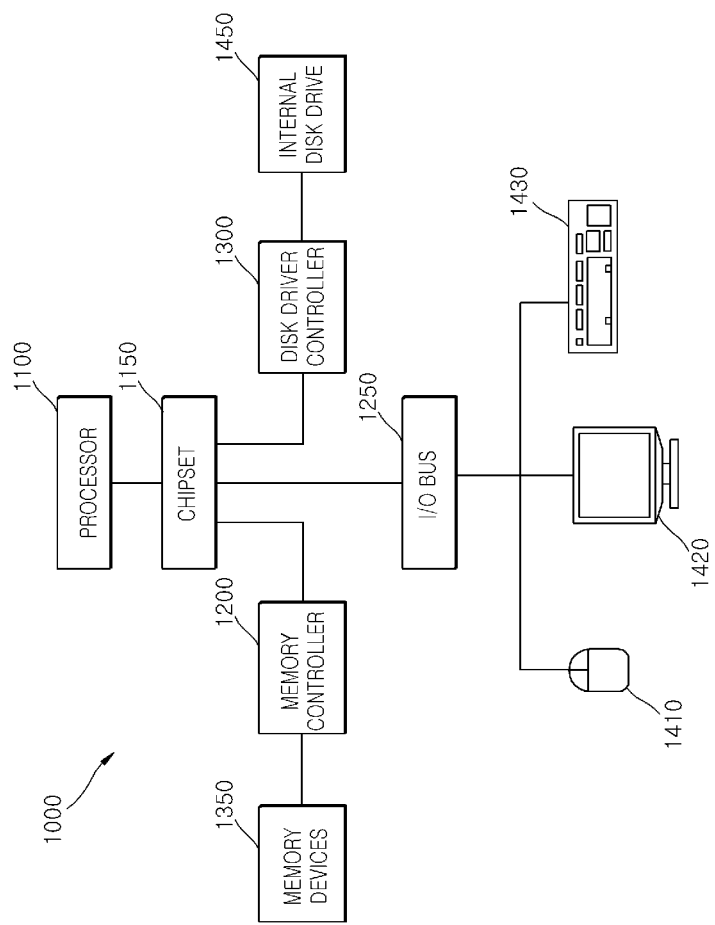
FIG. 7 illustrates a block diagram of a system employing a memory controller circuit in accordance with an embodiment of the invention.

Referring to FIG. 7, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may also be electrically coupled to one or more memory devices 1350. The memory device 1350 may include the semiconductor device described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset and one or more internal disk drives 1450. The disk drive controller 1300 and the internal disk drive 1450 may communicate with each other and the chipset using virtually any type of communication protocol.

The semiconductor devices as set forth above may terminate a refresh operation in a refresh mode when a refresh termination command signal is inputted thereto.

What is claimed is:

1. A semiconductor device comprising:
   a pre-internal refresh signal generator suitable for receiving a first periodic signal in response to a refresh termination command signal during a refresh operation to generate a pre-internal refresh signal including pulses which are periodically created; and
   an internal refresh signal generator suitable for receiving a second periodic signal during the refresh operation to generate first and second internal refresh signals sequentially enabled by the pulses of the pre-internal refresh signal; and
   wherein the second periodic signal has an opposite phase to the first periodic signal during the refresh operation.

2. The semiconductor device of claim 1, wherein the first and second periodic signals are periodically toggled during the refresh operation in response to an enablement signal.

3. The semiconductor device of claim 1, wherein the pulses of the pre-internal refresh signal are not generated after the refresh termination command signal is inputted to the pre-internal refresh signal generator during the refresh operation.

4. The semiconductor device of claim 1, wherein the pre-internal refresh signal generator includes:
   a first pulse generator suitable for generating a transmission control signal including pulses created in response changes to the first periodic signal;
   a signal transmitter suitable for latching the refresh termination command signal in response to the pulses of the transmission control signal to generate a level signal;
   a delay unit suitable for retarding the first periodic signal by a predetermined time to generate a delay signal;
   a second pulse generator suitable for generating a delay pulse signal including pulses which are created in response changes to the delay signal; and
   a logic unit suitable for buffering the delay pulse signal according to a level of the level signal to generate the pre-internal refresh signal.

5. The semiconductor device of claim 1, wherein the internal refresh signal generator includes:
   a counter suitable for outputting first and second count signals counted in response to changes in the second periodic signal;
   a selection signal generator suitable for outputting the first and second count signals as first and second selection signals and suitable for generating a termination signal enabled when a level combination of the first and second count signals outputted from the counter is identical to a predetermined level combination or when the refresh termination command signal is inputted thereto; and
   a multiplexer suitable for outputting a pulse of the pre-internal refresh signal as a pulse of one of the first and second internal refresh signals in response to the first and second selection signals.

6. The semiconductor device of claim 1, further comprising:
   an internal circuit including a plurality of banks to execute the refresh operation in response to the first and second internal refresh signals.

7. A semiconductor device comprising:
   a periodic signal generator suitable for generating first and second periodic signals periodically toggled in response to a refresh command signal; and
   a refresh signal generator suitable for generating first and second internal refresh signals sequentially enabled by the first and second periodic signals from a point of time that the refresh command signal is inputted to the periodic signal generator till a point of time that a refresh termination command signal is inputted; and
   wherein the second periodic signal has an opposite phase to the first periodic signal during the refresh operation.

8. The semiconductor device of claim 7, wherein the first and second periodic signals are periodically toggled during a refresh operation.

9. The semiconductor device of claim 7, wherein the periodic signal generator includes:
   a command input buffer suitable for receiving the refresh command signal to generate a refresh signal which is enabled;
   a first pulse generator suitable for outputting an enablement signal RODEN generated when the refresh signal is enabled; and
   an oscillator suitable for generating the first and second periodic signals periodically toggled in response to the enablement signal.

10. The semiconductor device of claim 9, further comprising:
    a first logic unit suitable for receiving the second periodic signal to generate the disablement signal enabled after a predetermined delay time elapses from a point of time that a termination signal is inputted.

11. The semiconductor device of claim 10, wherein the predetermined delay time of the first logic unit is less than a cycle time of the first and second periodic signals.

12. The semiconductor device of claim 10, wherein the oscillator does not toggle the first and second periodic signals when the disablement signal is enabled.

13. The semiconductor device of claim 7, wherein the refresh signal generator includes:
    a pre-internal refresh signal generator suitable for generating a pre-internal refresh signal including pulses which are periodically created by the first periodic signal in response to the refresh termination command signal during a refresh operation; and
    an internal refresh signal generator suitable for generating the first and second internal refresh signals sequentially enabled by the pulses of the pre-internal refresh signal in response to the second periodic signal during the refresh operation.

14. The semiconductor device of claim 13, wherein the pulses of the pre-internal refresh signal are not generated after the refresh termination command signal is inputted to the pre-internal refresh signal generator.

15. The semiconductor device of claim 13, wherein the pre-internal refresh signal generator includes:
    a second pulse generator suitable for generating a transmission control signal including pulses which are created in response to changes to the first periodic signal;
    a signal transmitter suitable for latching the refresh termination command signal in response to the pulses of the transmission control signal to generate a level signal;
    a delay unit suitable for retarding the first periodic signal by a predetermined time to generate a delay signal;
    a third pulse generator suitable for generating a delay pulse signal including pulses which are created in response to changes to the delay signal; and
    a logic unit suitable for buffering the delay pulse signal according to a level of the level signal to generate the pre-internal refresh signal.

16. The semiconductor device of claim 13, wherein the internal refresh signal generator includes:
- a counter suitable for outputting first and second count signals counted in response to changes to the second periodic signal;
- a selection signal generator suitable for outputting the first and second count signals as first and second selection signals and suitable for generating a termination signal enabled when a level combination of the first and second count signals outputted from the counter is identical to a predetermined level combination or when the refresh termination command signal is inputted; and
- a multiplexer suitable for outputting a pulse of the pre-internal refresh signal as a pulse of one of the first and second internal refresh signals in response to the first and second selection signals.

17. The semiconductor device of claim 7, further comprising:
- an internal circuit including a plurality of banks to execute a refresh operation in response to the first and second internal refresh signals.

18. A semiconductor device comprising:
- a periodic signal generator configured to receive a refresh command signal to generate a first periodic signal and a second periodic signal which are periodically toggled during a refresh operation;
- a pre-internal refresh signal generator configured to receive the first periodic signal to generate a pre-internal refresh signal before a refresh termination command signal; and
- an internal refresh signal generator configured to receive the second period signal to generate first to fourth internal refresh signals enabled by the pre-internal refresh signal; and
- wherein the second periodic signal has an opposite phase to the first periodic signal during the refresh operation.

* * * * *